United States Patent
Liu et al.

(10) Patent No.: US 9,000,760 B2
(45) Date of Patent: Apr. 7, 2015

(54) APPARATUS AND METHOD FOR RESETTING A Z-AXIS SENSOR FLUX GUIDE

(75) Inventors: Lianjun Liu, Chandler, AZ (US); Phillip Mather, Phoenix, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 404 days.

(21) Appl. No.: 13/406,149

(22) Filed: Feb. 27, 2012

(65) Prior Publication Data
US 2013/0221949 A1    Aug. 29, 2013

(51) Int. Cl.
*G01R 33/02*    (2006.01)
*G01R 33/00*    (2006.01)
*G01R 33/09*    (2006.01)

(52) U.S. Cl.
CPC .......... *G01R 33/0011* (2013.01); *G01R 33/093* (2013.01)

(58) Field of Classification Search
CPC .......................... G01R 33/0011; G01R 33/093
USPC .................... 324/202, 251, 252, 244
See application file for complete search history.

(56) References Cited

U.S. PATENT DOCUMENTS

| | | | |
|---|---|---|---|
| 5,732,016 A | 3/1998 | Chen et al. | |
| 5,818,222 A * | 10/1998 | Ramsden | 324/202 |
| 6,404,192 B1 * | 6/2002 | Chiesi et al. | 324/253 |
| 7,259,556 B2 | 8/2007 | Popovic et al. | |
| 2004/0194292 A1 | 10/2004 | Dionisius Van Zon | |
| 2006/0202699 A1 * | 9/2006 | Reiderman | 324/339 |
| 2008/0054897 A1 * | 3/2008 | Crolly et al. | 324/252 |
| 2010/0194384 A1 | 8/2010 | Hammerschmidt | |
| 2011/0074406 A1 | 3/2011 | Mather et al. | |
| 2011/0169488 A1 | 7/2011 | Mather et al. | |
| 2011/0210722 A1 * | 9/2011 | Paci et al. | 324/207.25 |
| 2013/0169271 A1 * | 7/2013 | Nordman et al. | 324/222 |

OTHER PUBLICATIONS

Search Report & Written Opinion mailed May 10, 2013 in PCT/US2013/027653.

* cited by examiner

*Primary Examiner* — Patrick Assouad
*Assistant Examiner* — Demetrius Pretlow
(74) *Attorney, Agent, or Firm* — Bookoff McAndrews, PLLC (57) ABSTRACT

A method and apparatus eliminate magnetic domain walls in a flux guide by applying, either simultaneously or sequentially, a current pulse along serially positioned reset lines to create a magnetic field along the flux guide, thereby removing the magnetic domain walls. By applying the current pulses in parallel and stepping through pairs of shorter reset lines segments via switches, less voltage is required.

27 Claims, 5 Drawing Sheets

| TIME | S151 | S153 | S154 | S157 |
|------|------|------|------|------|
| $t_1$ | 1 | 0 | 0 | 0 |
| $t_2$ | 1 | 1 | 0 | 0 |
| $t_3$ | 0 | 1 | 1 | 0 |
| $t_4$ | 0 | 0 | 1 | 1 |
| $t_5$ | 0 | 0 | 0 | 1 |

| TIME | S711,713 | S712,714 | S721,724 | S713,715 | S714,716 | S724,726 | S715,717 | S716,718 |
|---|---|---|---|---|---|---|---|---|
| $t_1$ | 1 | 1 | 0 | 0 | 0 | 0 | 0 | 0 |
| $t_2$ | 0 | 0 | 0 | 1 | 1 | 0 | 0 | 0 |
| $t_3$ | 0 | 0 | 0 | 0 | 0 | 0 | 1 | 1 |

APPARATUS AND METHOD FOR RESETTING A Z-AXIS SENSOR FLUX GUIDE

FIELD

The exemplary embodiments described herein generally relate to the field of magnetoelectronic devices and more particularly to CMOS compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally are anisotropic magnetoresistance (AMR) based devices. In order to arrive at the required sensitivity and reasonable resistances that mesh well with CMOS, the sensing units of such sensors are generally on the order of square millimeters in size. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred. Typically, a Wheatstone bridge structure uses magnetic shields to suppress the response of reference elements within the bridge so that only the sense elements (and hence the bridge) respond in a predetermined manner. However, the magnetic shields are thick and their fabrication requires carefully tuned NiFe seed and plating steps. Another drawback associated with magnetic shields arises when the shield retains a remnant field when exposed to a strong (~5 kOe) magnetic field, since this remnant field can impair the low field measuring capabilities of the bridge structure. To prevent the use of magnetic shields and to sense an external magnetic in three axis (X, Y, Z), three Wheatstone bridge structures (one for each axis) are used. The layers of each bridge structure are fabricated in the same processes in similar layers. In order to sense the magnetic field in the Z axis, flux guides are used to guide the Z axis field into the X-Y plane to be sensed by one of the bridge structures. These flux guides have a preferred magnetization orientation for optimal Z axis response. Exposure to a very large external field in a particular orientation can reorient the flux guide magnetization so that upon returning to its low field sensing configuration, magnetic domain walls may be present in the Z axis flux guides. The tiny fluctuations in the dipolar field at the sense element generated by temperature induced motion of these domain walls along the flux guide length can elevate the overall sensor noise above the lowest achievable output noise, and reduce signal to noise ratio (SNR).

Accordingly, a need exists for an improved design and fabrication process for forming a single chip magnetic sensor that is responsive an applied magnetic field in three dimensions in which magnetic domain walls in the Z axis flux guides may be eliminated, should the sensor be exposed to a large magnetic field. There is also a need for a three-axis sensor that can be efficiently and inexpensively constructed as an integrated circuit structure for use in mobile applications. There is also a need for an improved magnetic field sensor and fabrication to overcome the problems in the art, such as outlined above. Furthermore, other desirable features and characteristics of the present invention will become apparent from the subsequent detailed description and the appended claims, taken in conjunction with the accompanying drawings and this background.

BRIEF SUMMARY

A method and structure is/are provided for removing magnetic domains in Z-axis flux guides created by high external fields.

A first exemplary embodiment is a method of resetting flux guides in a field sensor, comprising applying a first field to first portion of a flux guide; applying a second field to a second portion of the flux guide; applying a third field to a third portion of the flux guide; and applying a fourth field to a fourth portion of the flux guide.

A second exemplary embodiment is a method of resetting a flux guide in a field sensor, the flux guide including n adjacent portions, wherein each portion has one of a plurality of n reset lines positioned adjacent thereto, where n is an integer greater than 1, the method comprising applying one of n current pulses to each of the n reset lines.

A third exemplary embodiment is a field sensor including a plurality of magnetic field sensors, each sensor, comprising a sense element defining a plane; a flux guide configured to direct a magnetic field perpendicular to the plane into the plane, the flux guide including n adjacent portions of a continuous line, where n is an integer greater than 1; a plurality of n reset lines, each reset line positioned uniquely adjacent one of the n portions; and circuitry coupled to the reset lines and configured to apply a plurality of current pulses, one each to each of the n reset lines, thereby creating a field in each of the portions.

BRIEF DESCRIPTION OF THE DRAWINGS

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

During the course of this description, like numbers are used to identify like elements according to the different figures that illustrate the various exemplary embodiments.

Figure 1:
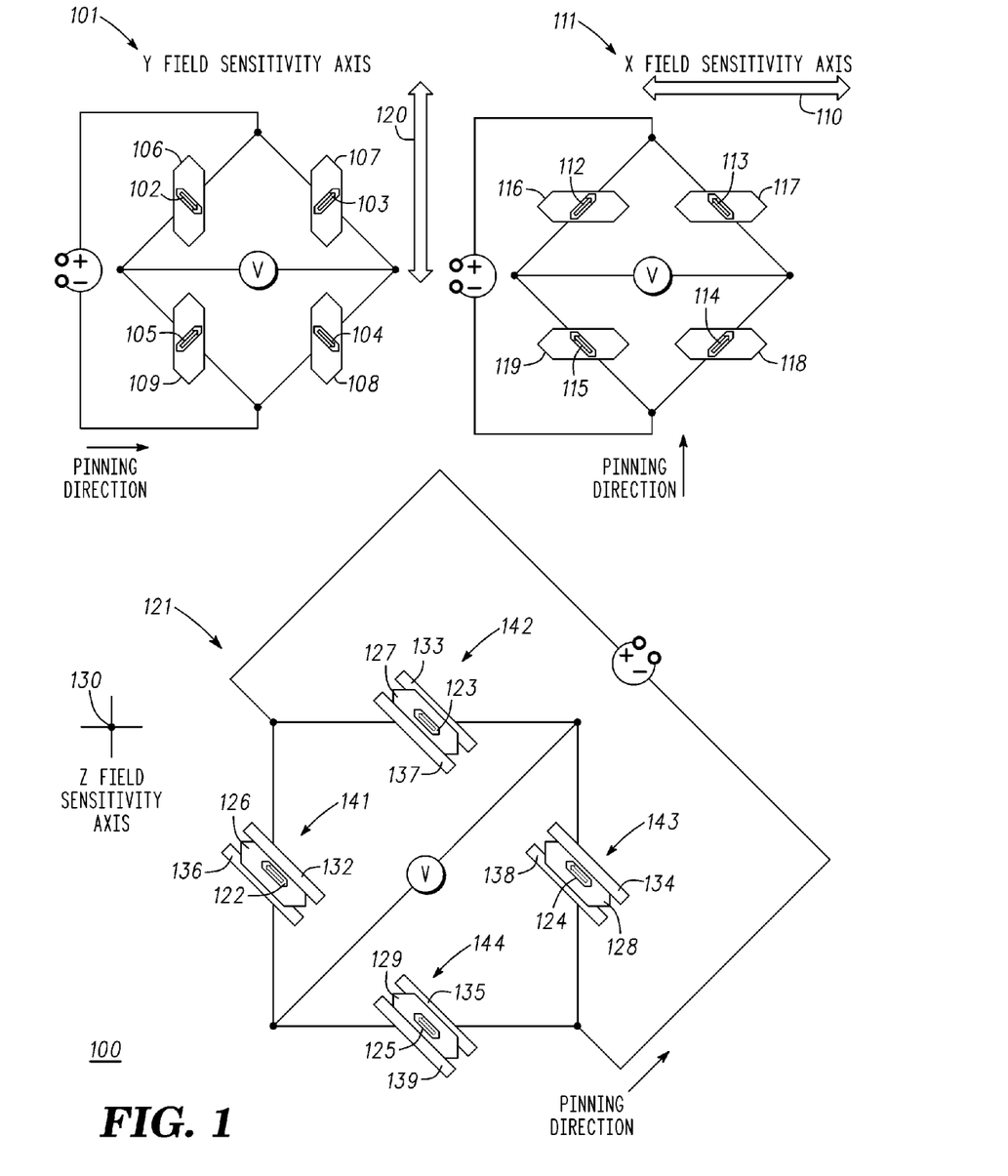
FIG. 1 illustrates an electronic compass structure which uses differential sensors formed from three bridge structures with MTJ sensors.
Figure 2:
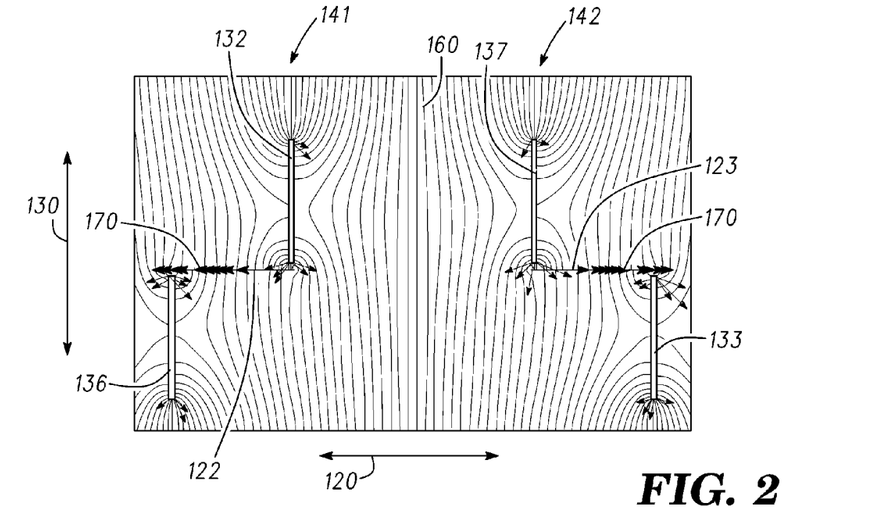
FIG. 2 is a view of flux lines as calculated by finite element simulation of two of the four magnetic tunnel junction sensors of FIG. 1.

Through the integration of high aspect ratio vertical bars (flux guides) of a high permeability material, for example, nickel iron (NiFe), whose ends terminate in close proximity to opposed edges and/or opposite sides of a magnetic sense element, a portion of the Z axis field can be guided into the XY plane (see FIGS. 1 and 2). These flux guides serve to capture magnetic flux from an applied field oriented in the Z direction, and in so doing, bend the field lines in a substantially horizontal manner near the ends of the flux guides. Through asymmetric positioning of the flux guides, e.g., the flux guide segment above the left edge of sense elements in two legs of the four legs of a Wheatstone bridge, and the flux guide above the right edge of sense elements in the other two legs, the horizontal components may act in an opposite directions for the two pairs of legs resulting in a strong differential signal. A field applied in the X or Y direction will project equally on all four legs of the bridge and hence be subtracted out and not contribute to the final sensor signal. Separate bridges are included elsewhere on the magnetic sensor chip for determining the X and Y components of the magnetic signal, and in this manner, a field with components in all three spatial orientations can be accurately determined by a single chip magnetoresistive sensing module, for example, based on magnetic tunnel junction (MTJ) sense elements. Finite Element Method (FEM) simulations have shown that a pair of high aspect ratio flux guides, e.g., 25 nm wide by 500 nm high and extending several microns in the third direction, when optimally positioned will provide a signal on an individual element that is about 80% of the of the signal measured from an in plane (x axis) field of the same strength. Additional signal may be obtained through closer proximity of the flux guide to the sensor, increases in the flux guide height, and additional shaping of the guide geometry. These geometries serve to further enhance the horizontal component of the guided flux and move it to a more central region of the sensor. A structure with individual 25 nm wide vertical bars utilized as flux guides is tolerant to overlay errors and produces an apparent x to z field conversion (for a differentially wired Wheatstone bridge) at the rate of 2.5% for a misalignment of 85 nm (3 sigma) between a single flux guiding layer and the sense layer.

The flux guiding layer may be formed from layers typically used in the magnetic random access memory (MRAM) process flow, during which bit and digit lines cladded with a high permeability magnetic material (such as in typical magnetic memory devices), referred to herein as a flux guide, are used to increase the field factors present to reduce the current needed to switch the memory storage element. In the sensor application, the same process flow may be used with the optional additional step of sputtering out the bottom of the digit line in order to remove any cladding present on the trench's bottom. Modifications may be made to the process flow so that the height and width of the cladding used for flux guiding are at optimum values instead of the 500 nm and 25 nm, respectively that are used in the exemplary process described above.

A drawback to using flux guides in a Z axis to direct the flux into the X-Y plane of the Z field sensor in the X-Y plane of the Wheatstone bridge is the formation of magnetic domain walls in the flux guide. These magnetic domain walls create noise that may lower the SNR during measurements of an external field. The exemplary embodiments described herein eliminate these magnetic domain walls.

A method and apparatus are described in more detail for eliminating magnetic domain walls in a flux guide by applying a plurality of current pulses through a plurality of parallel reset lines or sequentially applying a current pulse along serially positioned reset lines to create a magnetic field sequentially progress along the length of the flux guide. The reset lines may be on one side of the flux guides with the current pulse directed in a first direction, or the reset lines may be positioned on opposed sides of the flux guides with the current pulse directed in opposed directions on the opposed sides. As the magnetic field generated by the sequentially applied current pulses progresses along the flux guide, the magnetic domains are swept along the length of the guide and through the end, thereby removing the magnetic domain walls in the process. By applying the current pulses along the series of shorter reset lines, less voltage is required over that required by passing the current pulse through one entire reset line.

More specifically, the reset/stabilization line is divided into multiple segments. These segments are connected in parallel which enables the flow of a relatively high current required by reset field at a given supply voltage. The reset current through these line segments can be applied simultaneously or sequentially with some spatial and temporal overlap by the introduction of the switches in series with the segmented reset/stabilization line as well as switches that directly connect various sections of the reset line either to power or to ground. Those switches enable the application of the reset current pulses through each segment or a subset of segments in parallel (when these switches are open), simultaneously or sequentially with overlap, and stabilization current serially (when these switches are closed).

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

FIG. 1 shows a magnetic field sensor 100 (as described in U.S. patent application Ser. No. 13/031,558 assigned to the Assignee of this present application) formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 1 is situated. Exemplary embodiments of the first and second sensors 101, 111 are described in detail in U.S. patent application Ser. No. 12/433,679. As depicted herein, each sensor 101, 111, 121 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the x-axis direction. In similar fashion, the second sensor 111 is formed from the connection of a plurality of sense elements 112-115 in a bridge configuration over a corresponding plurality of pinned layers 116-119 that are each magnetized in the y-axis direction that is perpendicular to the magnetization direction of the pinned layers 106-109. Furthermore, the third sensor 121 in the same plane as the first and second sensors 101, 111 is formed from the connection of a plurality of sense elements 122-125 in a bridge configuration over a corresponding plurality of pinned layers 126-129 that are each magnetized along either the xy-axis direction to the magnetization direction of the pinned layers 106-109 and 116-119. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the third bridge configuration 121, the sense elements 122 123,124, and 125 all have an easy axis magnetization direction that is orthogonal to the pinned magnetization direction of the pinned layers 126, 127, 128, and 129. The third bridge configuration 121 further includes flux guides 132-135 positioned adjacent to the right edge of sense elements 122-125, and flux guides 136-139 positioned adjacent to the left edge of sense elements 122-125, respectively. Flux guides 132,137, 134, and 139 are positioned above sense elements 122-125, and flux guides 136, 133, 138, and 135 are positioned below sense elements 122-125. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by 90 degrees for the x and y sensors, and referencing a sense element that responds in an opposite manner to an applied field in the Z direction for the Z sensor. The Z sensor referencing will be described in more detail below. The configuration shown in FIG. 1 is not required to harvest the benefits of the third sensor 121 structure generally described in FIG. 2, and is only given as an example.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 132,133,136,137 are positioned in sensor 121 above and below the opposite edges of the elements 122-123, in an asymmetrical manner between legs 141 and 142. As flux guide, 137 is placed above sense element 123, the magnetic flux from the Z field may be guided by the flux guides 137 and 133 into the xy plane along the right side and cause the magnetization of sense element 123 to rotate in a first direction towards a higher resistance. Similarly, the magnetic flux from the Z field may be guided by the flux guides 132 and 136 into the xy plane along the left side of the sense element and cause the magnetization of sense element 122 to rotate in a second direction, opposite from the first direction towards a lower resistance as these guides are antisymmetric to guides 137, 133. Thus, the sensor 121 can detect the component directions of an applied field along the third axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. Each of the pinned layers 106-109, 116-119, and 126-129 may be formed with one or more lower ferromagnetic layers, and each of the sense elements

102-105, 112-125, 122-125 may be formed with one or more upper ferromagnetic layers. An insulating tunneling dielectric layer (not shown) may be disposed between the sense elements 102-105, 112-125, 122-125 and the pinned layers 106-109, 116-119, and 126-129. The pinned and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, pinned layers 106-109, 116-119, and 126-129 may be formed with one or more layers of ferromagnetic and antiferromagnetic materials to a combined thickness in the range 10 to 1000 Å, and in selected embodiments in the range 200 to 350 Å. In an exemplary implementation, each of the pinned layers 106-109, 116-119, and 126-129 is formed with a single ferromagnetic layer and an underlying anti-ferromagnetic pinning layer. In another exemplary implementation, each pinned layer 106-109, 116-119, and 126-129 includes a synthetic anti-ferromagnetic stack component (e.g., a stack of CF (Cobalt Iron), Ruthenium (Ru), and CFB (Cobalt Iron Boron)) which is 20 to 80 Å thick, and an underlying anti-ferromagnetic pinning layer that is approximately 200 Å thick. The lower anti-ferromagnetic pinning materials may be re-settable materials, such as IrMn, though other materials, such as PtMn, can be used which are not readily re-set at reasonable temperatures. As formed, the pinned layers 106-109, 116-119, and 126-129 function as a fixed or pinned magnetic layer when the direction of its magnetization is pinned in one direction that does not change during normal operating conditions. As disclosed herein, the heating qualities of the materials used to pin the pinned layers 106-109, 116-119, and 126-129 can change the fabrication sequence used to form these layers.

One of each of the sense elements 102-105, 112-125, 122-125 and one of each of the pinned layers 106-109, 116-119, 126-129 form a magnetic tunnel junction (MTJ) sensor. For example, for bridge circuit 121, sense element 122 and pinned layer 126 form an MTJ sensor 141. Likewise, sense element 123 and pinned layer 127 form an MTJ sensor 142, sense element 124 and pinned layer 128 form an MTJ sensor 143, and sense element 125 and pinned layer 129 form an MTJ sensor 144.

The pinned layers 106-109, 116-119, and 126-129 may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-125, 122-125 may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the sense elements 102-105, 112-125, 122-125 function as a sense layer or free magnetic layer because the direction of their magnetization can be deflected by the presence of an external applied field, such as the Earth's magnetic field. As finally formed, sense elements 102-105, 112-125, 122-125 may be formed with a single ferromagnetic layer having a magnetization direction (indicated with the arrows) that aligns along the long-axis of the patterned shapes.

The pinned layers 106-109, 116-119, 126-129 and sense elements 102-105, 112-125, 122-125 may be formed to have different magnetic properties. For example, the pinned layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-125, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about 30-100X larger than the anisotropy field of the sense electrodes, although different ratios may be used by adjusting the respective magnetic properties of the electrodes using well known techniques to vary their composition.

The pinned layers 106-109, 116-119, 126-129 in the MTJ sensors are formed to have a shape determined magnetization direction in the plane of the pinned layers 106-109, 116-119, 126-129 (identified by the vector arrows for each sensor bridge labeled "Pinning direction" in FIG. 1). As described herein, the magnetization direction for the pinned layers 106-109, 116-119, 126-129 may be obtained using shape anisotropy of the pinned electrodes, in which case the shapes of the pinned layers 106-109, 116-119, 126-129 may each be longer in the pinning direction for a single pinned layer. Alternatively, for a pinned SAF structure, the reference and pinned layers may be shorter along the pinning direction. In particular, the magnetization direction for the pinned layers 106-109, 116-119, 126-129 may be obtained by first heating the shaped pinned layers 106-109, 116-119, 126-129 in the presence of a orienting magnetic field which is oriented non-orthogonally to the axis of longest orientation for the shaped pinned layers 106-109, 116-119, 126-129 such that the applied orienting field includes a field component in the direction of the desired pinning direction for the pinned layers 106-109, 116-119, 126-129. The magnetization directions of the pinned layers are aligned, at least temporarily, in a predetermined direction. However, by appropriately heating the pinned layers during this treatment and removing the orienting field without reducing the heat, the magnetization of the pinned layers relaxes along the desired axis of orientation for the shaped pinned pinned layers 106-109, 116-119, 126-129. Once the magnetization relaxes, the pinned layers can be annealed above the recrystallization temperature to set the antiferromagnet (in the case of PtMn) or cooled below the blocking temperature (in the case of IrMn) so that the magnetic field direction of the pinned electrode layers is set in the desired direction for the shaped pinned layers 106-109, 116-119, 126-129.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

FIG. 2 is a view of flux lines as calculated by finite element simulation of MTJ devices 141, 142 of FIG. 1 with a magnetic field in the z direction imparted upon the sense elements 122-123. FEM modeling shows the resultant magnetic flux lines 160, exhibiting a component in the plane of the sensor. MTJ device 141 is represented by flux guides 132 and 136 on opposed ends of the sensing element 122. MTJ device 142 is represented by flux guides 133 and 137 on opposed ends of the sensing element 123. Stated otherwise, sensing element 122 extends from flux guides 132 and 136, and sensing element 123 extends from flux guides 133 and 137. The magnetic field 160 in the Z-axis 130 produces an asymmetric response in the sensing elements 122, 123 along the X-axis 120 as indicated by the arrows 170. In this manner, for a field 160 in the Z direction 130 directed towards the bottom of the page, the magnetization of sense element 122 rotates away from the pinning direction (and to higher resistance) of the pinned layer 126, while the magnetization of sense element 123 rotates towards the pinning direction (and to lower resistance) of pinned layer 127. For a field in the X direction 120, both elements 122, 123 show induced magnetization in the same direction (towards higher or lower resistance). Therefore, by wiring MTJ elements 141, 142 in a Wheatstone bridge for differential measurement and subtracting the resistances of MTJ devices 141, 142, the X field response is eliminated and twice the Z field response is measured.

However, a strong magnetic field 160 will cause the magnetization of the flux guide to wind up completely out of plane of the sensor substrate. When the magnetization relaxes from this high field state, the chirality of the relaxation path may differ in adjacent regions of a single flux guide, resulting in local magnetization that points in opposite directions along the length of the flux guide. This will create magnetic domain walls in the flux guides 132, 137. The domain walls may subsequently travel up and down the length of the flux guide due to low level thermal excitations, thereby modulating the local field at the sense elements, and hence elevate the noise floor above the lowest possible minimum. A subsequent measurement of a low external field will then take place over the elevated noise floor, degrading the overall sensor SNR. The exemplary embodiments described herein eliminate these magnetic domain walls.

Figure 3:
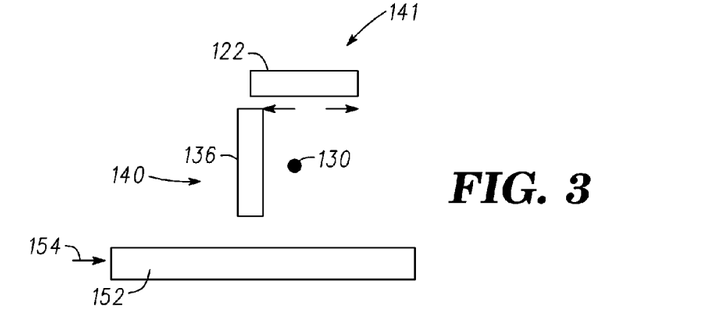
FIG. 3 is a partial cross section of the Z axis bridge structure of FIG. 1 in accordance with a first exemplary embodiment.

Referring to FIG. 3 and in accordance with an exemplary embodiment of the present invention, a partial cross section of the MTJ devices 141 of the third bridge circuit 121 include the sense element 122, and the flux guide 136, all formed within the dielectric material 140. The flux guide 136 has an end positioned below an edge of the sensor element 122. A metal stabilization/reset line 152 is positioned on one side of the MTJ device 141, and orthogonal to the flux guide 136, for providing a large current pulse 154 in a direction 154, for example, that creates a reset field 130 acting upon both the sense elements and the flux guide 136. The reset field 130 is represented by a dot indicating its direction is coming from the page. Alternatively, the metal line 152 may be on opposed sides (not shown) of the MTJ device 141 with the current pulse flowing in opposed directions. The same line 152 can also be used as stabilization line. A current flowing through 152 creates a stabilization field at the sense elements 122. The ends of the flux guides may be brought as close as possible to the sensor elements, with a preferable spacing of less than or equal to 500 nm between the two.

Figure 4:
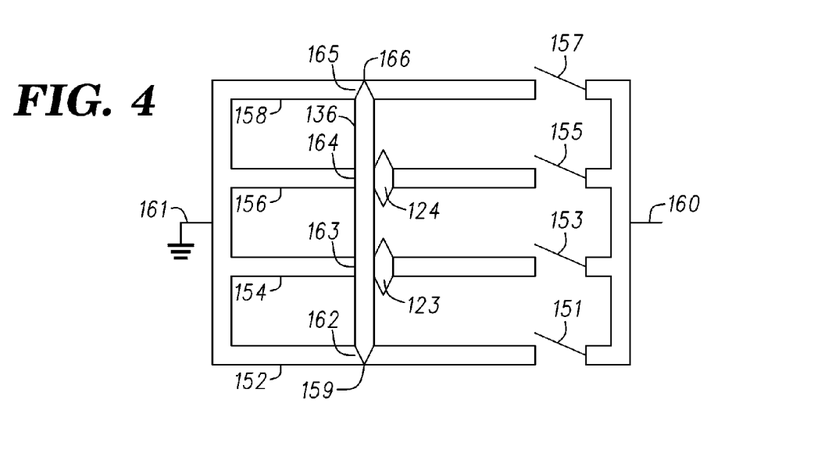
FIG. 4 is a top view of the reset lines and sensors in accordance with the first exemplary embodiment of FIG. 3.

A top view of the structure of FIG. 3 is shown in FIG. 4 and includes switches 151, 153, 155, 157 coupling a voltage from conductor 160 through the reset lines 152, 154, 156, 158 to ground at conductor 161. A plurality of reset lines 152, 154, 156, 158 is positioned below, and orthogonal to, the flux guide 136. In another embodiment, the reset line can be placed above or on both sides of the flux guide and the sense elements.

Figure 5:
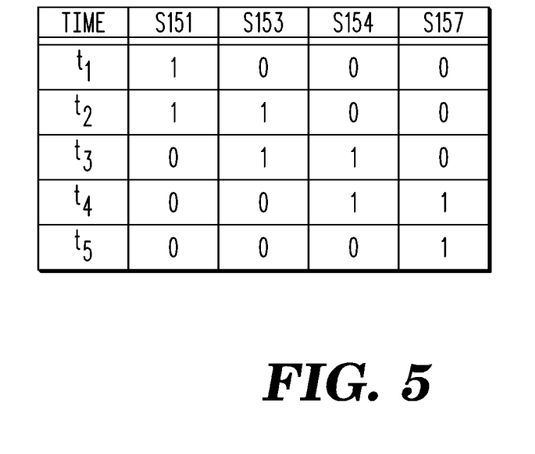
FIG. 5 is a chart of switch settings versus time for the first exemplary embodiment of FIG. 4.

In operation, the switches 151, 153, 155, 157 are "closed" in a sequence to provide a current pulse in the reset lines 152, 154, 156, 158 that creates the magnetic field 130 from one end 161 of the flux guide 136 to the other end 166 of the flux guide 136. An exemplary sequence for the closing of the switches 151, 153, 155, 157 is illustrated in the chart of FIG. 5 wherein a "1" signifies the switch is closed and a "0" signifies the switch is open. During time period t1, switch 151 is closed, creating a magnetic field in the portion 162 of the flux guide 136. The magnetic domain walls in the portion 162, if any, may be moved towards the other end 166 of the flux guide 136 by this magnetic field. However, if the current were removed from the reset line 152, the magnetic domain walls may come back and be reestablished in portion 162. In order to prevent this reestablishment of the magnetic domain, switch 151, as well as switch 153, are closed during time t2. Then during time t3, switches 153 and 155 are closed. In time t4, switches 155 and 157 are closed, and finally, during time t5, switch 157 is closed. This sequence of "sweeping" the magnetic reset field along the flux guide 136 sweeps the magnetic domain walls from one end to the other end of the flux guide, preventing the magnetic domains from being reestablished in the portions 162-165 after the reset field has been removed. At the end of the sequence, the entire flux guide is in a single domain state. By applying the reset current in sequence along series of reset lines 152, 154, 156, 158 instead of simultaneously along one long reset line, the individual reset line segment resistance can be significantly reduced. As a result, the magnitude of the reset current pulse is drastically increased given a certain reset bias voltage. The higher reset current pulse increases the reset field strength and therefore ability to remove the magnetic domain walls in the flux guide.

During measurement, a lower current pulse may be applied simultaneously through the switches 151, 153, 155, 157 to stabilize the sensor 122.

Another exemplary embodiment for reducing magnetic domain walls from the flux guide 136 is described with reference to FIGS. 7, 8, 9. A partial cross section (FIG. 6) of the MTJ devices 141 of the third bridge circuit 121 includes the sense element 122, and the flux guide 136. The flux guide 136 has an end positioned below an edge of the sensor element 122. A metal stabilization/reset line 702 is positioned on opposed sides of the MTJ device 141, and orthogonal to the flux guide 136, for providing a large current pulse in a direction (indicated by arrow 710), for example, that creates a reset field 130 acting on the sense elements and a reset field on the flux guide 136. The same line 702 can also be used as stabilization line. A current flowing through 702 creates a stabilization field on the sense elements 122. The stabilization/reset field 130 is represented by a dot indicating its direction is coming from the page. The ends of the flux guides may be brought as close as possible to the sensor elements, with a preferable spacing of less than or equal to 500 nm between the two.

Figure 6:
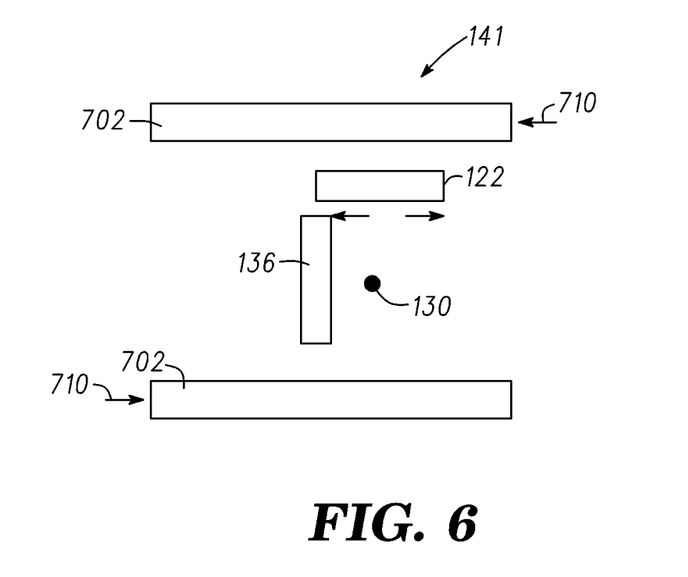
FIG. 6 is a partial cross section of the Z axis bridge structure of FIG. 1 in accordance with a second exemplary embodiment.
Figure 7:
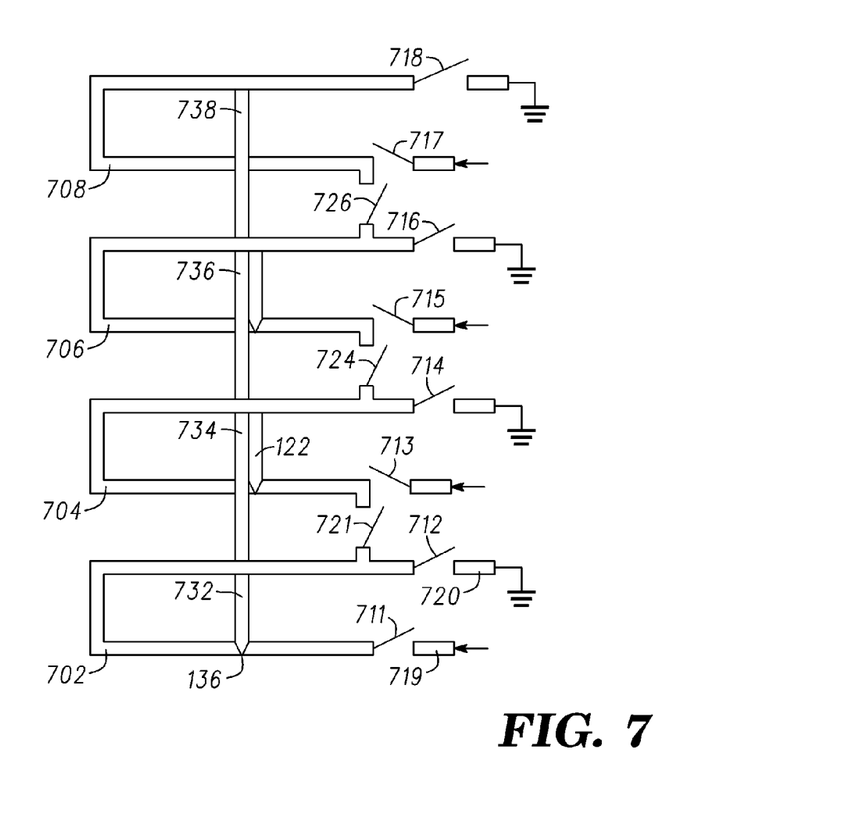
FIG. 7 is a top view of the reset lines and sensors in accordance with the second exemplary embodiment.
Figure 8:
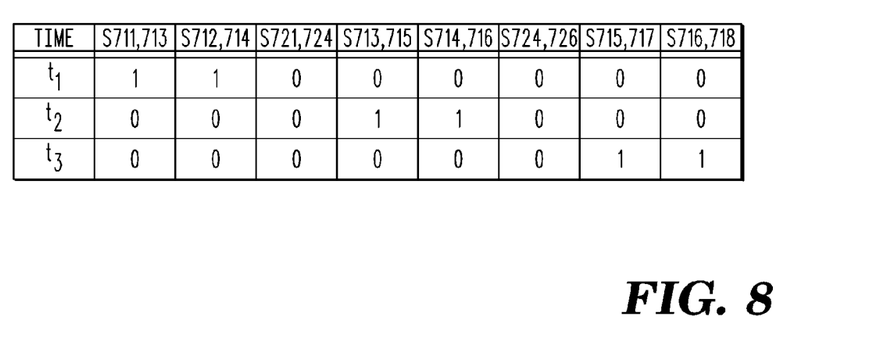
FIG. 8 is a chart of switch settings versus time for the second exemplary embodiment of FIG. 7.

A top view of the structure of FIG. 6 is shown in FIG. 7 and includes switch pairs 711, 712; 713, 714; 715, 716; and 717, 718. In stabilization mode, the switches are configured to couple a voltage from conductor 719 through the reset line segments 702, 704, 706, 708, respectively, to ground at conductor 718. Therefore, switches 711, 721, 724, 726, 718 are closed, while the rest are open. The plurality of reset lines 702, 704, 706, 708 are positioned orthogonal to the flux guide 136, and pass over the sense elements 122 in a first direction and under the sense elements 122 in a second direction. While the reset lines 702, 704, 706, 708 are offset for ease of description, they preferably are aligned with the center of the sense elements 122.

In flux guide reset operation, switches 721, 724, 726 are opened and the switch pairs 711, 712; 713, 714; 715, 716; and 717, 718 are "closed" in a sequence to provide current pulses in the reset line segments 702, 704, 706, 708 that creates the magnetic field 130 that sweeps in sequence from one end 732 of the flux guide 136 to the other end 738 of the flux guide 136. An exemplary sequence for the closing of the switch pairs 711, 712; 713, 714; 715, 716; and 717, 718 is illustrated in the chart of FIG. 8 wherein a "1" signifies the switch is closed and a "0" signifies the switch is open. During time period t1, switch pair 711 and 712 are closed, creating a magnetic field in the portion 732 of the flux guide 136. A magnetic domain wall in the portion 732, if present, may be moved towards the other end 738 of the flux guide 136 under this magnetic field. However, if the current were removed from the reset line 136, a magnetic domain wall may come back and be reestablished in portion 732. In order to prevent this reestablishment of the magnetic domain, switches 713 and 714, as well as switches 711 and 712, are closed during time t1. Then during time t2, switches 711 and 712 are opened, 713 and 714 stay closed, and switches 715 and 716 are closed. In time t4, switches 713 and 714 are opened, 715 and 716 stay closed, and switches 717 and 718 and are closed. This sequence of "walking" the magnetic reset field along the flux guide 136 sweeps the magnetic domain walls from one end of the flux guide to the other while preventing the magnetic domains from reestablishing in the portions wherein the magnetic domains had previously been removed after the reset field has been removed. By applying the reset current in a series of portions of the reset line 136 instead of along the entire reset line, the reset line resistance can be significantly reduced. As a result, the magnitude of the reset current pulse is drastically increased given a certain reset bias voltage. The higher reset current pulse increases the reset field strength and therefore ability to remove the magnetic domain walls in the flux guide.

Note that the flux guide reset line segments 732, 734, 736, 738 extend all the way to the ends of the flux guide 136 in order to completely clear any domain structure from the entire length of flux guide 136. If the same number of reset segments 732, 734, 736, 738 is used as those required to reset all the sense elements 122 in the array (see patent application Ser. No. 13/031,558, filed 21 Feb. 2011 by the Assignee of the present application), local fields may not be strong enough to clear domains from the end of the flux guide 136 as it necessarily extends beyond the final sense element in the array. In this manner, domains are not "stuck" near the ends of the flux guide 136. Otherwise after high field exposure (domain creation) and the subsequent flux guide reset, an exposure to a low field in the right direction can cause a domain wall near the end to travel back towards a sense element 122 and disrupt its local field response, resulting in noise at the sensor output. This is shown in FIG. 7 as the final reset line segments 702, 708 overly the ends of the flux guide 136, and no sense elements are present at the flux guide ends. As the ends of the flux guide 136 are pointed to trap domains, and prevent their nucleation at low and moderate fields, a higher local field is likely required to reverse domain structure at the end of the flux guide 136. This could be done by 1) increasing the voltage source at switch 717, 2) lengthening the width of the final pulse (increasing the time that switches 717 and 718 are closed at the end of the pulse train), or 3) increasing the flux reset line segment spatial density right at the flux guide end; i.e. segment 708 could be wider to allow a higher current to flow or could have several identical segments that are very close to one another, switched on at the same time. These temporal or intensity adjustments may be made at both ends of the flux guide, but are most important to incorporate at the final end to receive the reset pulse.

While the flux guide reset is preferably configured to reset all the sense elements 122, it may be required to insert additional reset line segments (not shown) between sense elements 122; i.e. covering the length between flux guide segments 734 and 736 to keep the domain walls traveling along length of the flux guide 136. This requirement depends upon the ease with which domains travel (field required to continue motion) along the length of the flux guide 136, which will depend upon material characteristics of the flux guides 136 as well as geometrical properties such as side wall roughness. As such, the flux guides materials should be selected from materials with a relatively high domain wall velocity for shorter pulse width, e.g., greater than 100 m/s for pulses of less than 100 ns, and the side walls should be as smooth as possible, to reduce the required pulse amplitude. Proper material selection and processing conditions will enable a lower density of reset line segments. Also, the end taper rules (which prefer AR>=2.5 for high domain wall nucleation threshold) may be relaxed to lower the field required at the flux guide ends. Because domain wall motion is slower than the sense element reversal time, it is highly beneficial to create two reset modes. The first reset mode is for the sense elements only, and may proceed with ns pulse width time scales, and a lower total pulse count (since it is not necessary to continue the pulse train all the way to the end of the flux guide). This mode will be required more frequently as a moderate field exposure is more commonplace, and could be incorporated to precede every measurement. The second reset mode would be to reset or clear the flux guide domain structure. Due to the domain wall velocity limitations, this would require pulse widths on the order of 1 μsec and require more pulses for a higher total current or power dissipation. However, this mode would be required much less frequently as the much larger field exposures required to create multi domain structures are quite infrequent. An algorithm to determine which reset to apply includes measuring the noise in the sensor output, applying a sense element reset if it is higher than a threshold, measuring the noise again, and applying a flux guide reset if it is still higher than the threshold. It may also be beneficial to apply a flux guide reset at sensor startup, to ensure that the flux guides are properly initialized. Also, reading from accelerometers and the in plane sensors may be utilized to predict what the Z component of the measured magnetic field should be based upon GPS location. If the measured Z component differs significantly from this predicted value, a flux guide reset may be applied.

During measurement, a lower current pulse may be applied simultaneously through the switches 711, 721, 724, 726 and 718 to stabilize the sensors 122.

Figure 9:
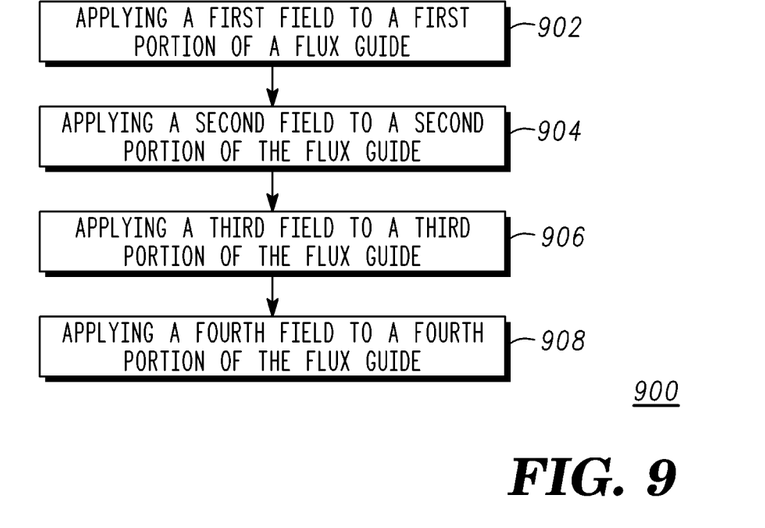
FIG. 9 is a flow chart of a first exemplary method for the disclosed embodiments.
Figure 10:
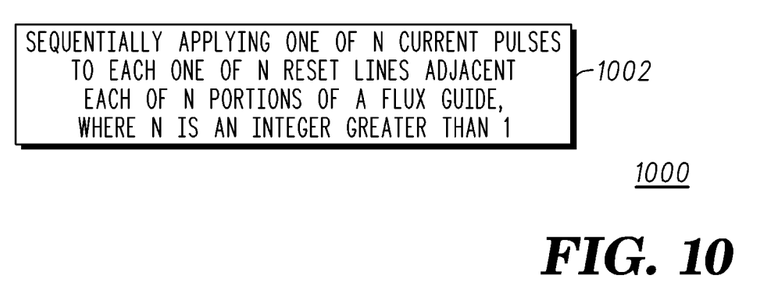
FIG. 10 is a flow chart of a second exemplary method for the disclosed embodiments

FIGS. 9 and 10 are flow charts that illustrate exemplary embodiments of a process 1000 and 1100 suitable for removing magnetic domains from the Z axis flux guide 136. It should be appreciated that processes 900 and 1000 may include any number of additional or alternative tasks, the tasks shown in FIGS. 9 and 10 need not be performed in the illustrated order, and processes 900 and 1000 may be incorporated into a more comprehensive procedure or process having additional functionality not described in detail herein. Moreover, one or more of the tasks shown in FIGS. 9 and 10 could be omitted from an embodiment of the processes 900 and 1000 as long as the intended overall functionality remains intact.

Referring to FIG. 9, the process 900 includes sequentially applying 902 a first field to a first portions of a flux guide, applying 902 a second field to a second portion of the flux guide, and applying 906 a third field to a third portion of the flux guide, and applying 908 a fourth field to a fourth portion of the flux guide.

The process 1000 of FIG. 10 includes applying one of N current pulses to each one of N reset lines adjacent each of N portions of a flux guide, where N is an integer greater than 1.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of resetting flux guides in a field sensor, comprising:
    applying a first field to a first portion of a flux guide to re-orient magnetic domains of the first portion of the flux guide to a predetermined orientation;
    applying a second field to a second portion of the flux guide to re-orient magnetic domains of the second portion of the flux guide to the predetermined orientation;
    applying a third field to a third portion of the flux guide to re-orient magnetic domains of the third portion of the flux guide to the predetermined orientation; and
    applying a fourth field to a fourth portion of the flux guide to re-orient magnetic domains of the third portion of the flux guide to the predetermined orientation.

2. The method of claim 1 wherein the application of the first, second, third, and fourth fields are applied simultaneously via applying an associated current pulse to an associated conductor which is adjacent an associated portion of the flux guide.

3. The method of claim 1 wherein the application of the first, second, third, and fourth fields are applied sequentially.

4. The method of claim 1 wherein the application of the first, second, third, and fourth fields comprises in sequence:
    applying the first and second fields;
    applying the second and third fields; and
    applying the third and fourth fields.

5. The method of claim 1 further comprising:
    creating the first field by applying a first current pulse to a first current line adjacent the first portion;
    creating the second field by applying a second current pulse to a second current line adjacent the second portion;
    creating the third field by applying a third current pulse to a third current line adjacent the third portion; and
    creating the fourth field by applying a fourth current pulse to a fourth current line adjacent the fourth portion.

6. The method of claim 1 further comprising:
    applying a stabilization current through the first through fourth portions while performing a measurement.

7. The method of claim 1 further comprising:
    removing the first field subsequent to applying the second field;
    removing the second field subsequent to applying the third field; and
    removing the third field subsequent to applying the fourth field.

8. A method of resetting a flux guide in a field sensor, the flux guide including n adjacent portions, wherein each portion has one of a plurality of n reset lines positioned adjacent thereto, where n is an integer greater than 1, the method comprising:
    applying one of n current pulses to each of the n reset lines and, in response thereto, generating a magnetic field in the n reset lines which re-orient magnetic domains of the flux guide to a predetermined orientation.

9. The method of claim 8 wherein the application of the n current pulses are applied simultaneously via applying a current pulse to a reset line which is adjacent and associated with a portion of the flux guide.

10. The method of claim 8 wherein the application of the n current pulses are applied sequentially.

11. The method of claim 8 wherein the application of the n current pulses comprises in sequence:
applying first and second current pulses to the nth and n−1 portions;
applying the second current pulse and a third current pulse to the n−1 and n−2 portions; and
applying the third current pulse and a fourth current pulse to the n−2 and n−3 portions.

12. The method of claim 8 further comprising:
creating a first field by applying a first current pulse to a first reset line adjacent a first portion;
creating a second field by applying a second current pulse to a second reset line adjacent a second portion;
creating a third field by applying a third current pulse to a third reset line adjacent a third portion; and
creating a fourth field by applying a fourth current pulse to a fourth current reset line adjacent a fourth portion.

13. The method of claim 12 further comprising:
removing the first field subsequent to applying the second field;
removing the second field subsequent to applying the third field; and
removing the third field subsequent to applying the fourth field.

14. The method of claim 8 further comprising:
applying a stabilization current through at least a subset of the n portions while performing a measurement.

15. The method of claim 8 wherein the n current pulses comprises a last current pulse producing a larger magnetic field effect than the other of the n current pulses.

16. The method of claim 15 wherein the larger magnetic field effect is accomplished by one of the steps selected from the group consisting of:
increasing a voltage driving the last current pulse; and
making the last current pulse longer than the other of the n current pulses.

17. The method of claim 8 further comprising in sequence:
measuring the noise in a field sensor output;
resetting sensor sense elements if the noise is higher than a threshold;
measuring the noise in the field sensor output; and
applying the n current pulses to reset the sensor flux guides if the noise remains higher than the threshold.

18. The method of claim 9 further comprising:
determining a predicted value of a to be measured magnetic field;
measuring the magnetic field;
accomplishing the applying step if the measured magnetic field differs from the predicted value by a threshold; and
measuring the magnetic field.

19. A field sensor including a plurality of magnetic field sensors, each sensor, comprising:
a sense element defining a plane;
a flux guide configured to direct a magnetic field perpendicular to the plane into the plane, the flux guide including n adjacent portions of a continuous line, where n is an integer greater than 1;
a plurality of n reset lines, each reset line positioned uniquely adjacent one of the n portions; and
circuitry coupled to the reset lines and configured to:
apply a plurality of current pulses, one each to each of the n reset lines, thereby creating a field in each of the portions to re-orient magnetic domains therein to a predetermined orientation.

20. The field sensor of claim 19 wherein the circuitry is further configured to:
apply the n fields simultaneously.

21. The field sensor of claim 19 wherein the circuitry is further configured to:
apply the n fields sequentially.

22. The field sensor of claim 19 wherein the circuitry is further configured to, in sequence:
apply the n and n+1 fields;
apply the n+1 and n+2 fields;
apply the n+2 and n+3 fields; and
apply the n+3 and n+4 fields.

23. The field sensor of claim 19 wherein the circuitry is further configured to:
create a first field by applying a first current pulse to a first reset line adjacent a first portion of the flux guide;
create a second field by applying a second current pulse to a second reset line adjacent a second portion of the flux guide;
create a third field by applying a third current pulse to a third reset line adjacent a third portion of the flux guide; and
create a fourth field by applying a fourth current pulse to a fourth reset line adjacent a fourth portion of the flux guide.

24. The field sensor of claim 19 wherein the circuitry is further configured to:
apply a stabilization current through at least a subset of the n current lines coupled in series.

25. The field sensor of claim 19 wherein the first, second, third, and fourth portions are consecutively adjacent one another.

26. The field sensor of claim 19 wherein the last of the n reset lines at an end of the flux guide comprises a higher spatial density than the other reset lines.

27. The field sensor of claim 19 wherein the flux guide comprises a material having a domain wall velocity of greater than 100 m/s for pulses of less than 100 ns.

* * * * *